US008283661B2

(12) United States Patent
Miyazawa et al.

(10) Patent No.: US 8,283,661 B2
(45) Date of Patent: Oct. 9, 2012

(54) ORGANIC EL DISPLAY AND METHOD FOR MANUFACTURING SAME

(75) Inventors: Kazutoshi Miyazawa, Osaka (JP); Akihisa Nakahashi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/130,408

(22) PCT Filed: Apr. 20, 2010

(86) PCT No.: PCT/JP2010/002847
§ 371 (c)(1),
(2), (4) Date: May 20, 2011

(87) PCT Pub. No.: WO2010/122782
PCT Pub. Date: Oct. 28, 2010

(65) Prior Publication Data
US 2011/0227104 A1    Sep. 22, 2011

(30) Foreign Application Priority Data

Apr. 24, 2009  (JP) ................................. 2009-106811
Apr. 24, 2009  (JP) ................................. 2009-106812

(51) Int. Cl.
*H01L 29/08* (2006.01)
*H01L 35/24* (2006.01)
*H01L 51/00* (2006.01)
*H01L 29/18* (2006.01)
*H01L 33/00* (2010.01)
*H01L 29/20* (2006.01)
*H01L 29/22* (2006.01)
*H01L 29/227* (2006.01)
*H01L 31/00* (2006.01)
*H01L 21/00* (2006.01)
*H01L 51/40* (2006.01)

(52) U.S. Cl. ................ 257/40; 257/88; 257/89; 257/98; 257/440; 257/E21.347; 257/E21.117; 257/E21.118; 257/E27.119; 257/E31.121; 257/E31.122; 257/E31.123; 257/E39.007; 257/E51.018; 257/E51.021; 257/E51.022; 257/E51.026; 438/4; 438/82; 438/99

(58) Field of Classification Search .................... 257/40, 257/88, 89, 98, 440, E21.347, E27.117, E27.118, 257/E27.119, E31.121, E31.122, E31.123, 257/E39.007, E51.018, E51.021, E51.022, 257/E51.026; 438/4, 82, 99
See application file for complete search history.

(56) References Cited

U.S. PATENT DOCUMENTS 5,986,729 A * 11/1999 Yamanaka et al. .............. 349/79
(Continued)

FOREIGN PATENT DOCUMENTS

JP            2002-260857 A        9/2002
(Continued)

OTHER PUBLICATIONS

International Search Report for PCT/JP2010/002847 dated Aug. 3, 2010.

*Primary Examiner* — Ida M Soward
(74) *Attorney, Agent, or Firm* — Pearne & Gordon LLP

(57) ABSTRACT

Provided is an organic EL display manufacturing method which has: a step wherein an organic EL panel having a substrate and organic EL elements arranged in matrix on the substrate is prepared, and each organic EL element is permitted to have a pixel electrode disposed on the substrate, an organic layer disposed on the pixel electrode, a transparent counter electrode disposed on the organic layer, a sealing layer disposed on the transparent counter electrode, and a color filter disposed on the sealing layer; a step of detecting a defective portion on the organic layer in the organic EL element; and a step of breaking the transparent counter electrode in a region on the defective portion of the transparent counter electrode by irradiating the region on the defective portion with a laser beam. The laser beam is radiated by being tilted with respect to the normal line on the display surface of the organic EL panel.

9 Claims, 17 Drawing Sheets

U.S. PATENT DOCUMENTS

| | | | |
|---|---|---|---|
| 6,067,134 A * | 5/2000 | Akiyama et al. | 349/74 |
| 6,509,942 B2 * | 1/2003 | Tanaka et al. | 349/113 |
| 7,057,680 B2 * | 6/2006 | Sato | 349/94 |
| 7,656,477 B2 * | 2/2010 | Sawayama et al. | 349/113 |
| 2002/0142697 A1 | 10/2002 | Yamagata et al. | |
| 2004/0004690 A1 * | 1/2004 | Yamaguchi et al. | 349/141 |
| 2004/0012726 A1 * | 1/2004 | Kano et al. | 349/43 |
| 2004/0202777 A1 | 10/2004 | Nishikawa et al. | |
| 2004/0263039 A1 * | 12/2004 | Takei et al. | 313/110 |
| 2005/0023523 A1 | 2/2005 | Kawaguchi et al. | |
| 2005/0215163 A1 | 9/2005 | Tamura et al. | |
| 2006/0114379 A1 * | 6/2006 | Nagayama et al. | 349/113 |
| 2006/0119724 A1 * | 6/2006 | Inuiya | 348/311 |
| 2006/0178072 A1 | 8/2006 | Konda | |
| 2006/0214575 A1 | 9/2006 | Kajiyama et al. | |
| 2006/0254639 A1 * | 11/2006 | Idota | 136/263 |
| 2007/0145887 A1 * | 6/2007 | Chae et al. | 313/504 |

FOREIGN PATENT DOCUMENTS

| | | |
|---|---|---|
| JP | 2004-227852 A | 8/2004 |
| JP | 2005-32576 A | 2/2005 |
| JP | 2005-276600 A | 10/2005 |
| JP | 2006-221982 A | 8/2006 |
| JP | 2006-269108 A | 10/2006 |
| JP | 2008-235178 A | 10/2008 |
| JP | 2009-016195 A | 1/2009 |
| JP | 2009-081093 A | 4/2009 |

* cited by examiner

ORGANIC EL DISPLAY AND METHOD FOR MANUFACTURING SAME

TECHNICAL FIELD

The present invention relates to an organic EL display and a manufacturing method for the same.

BACKGROUND ART

Recently, organic EL displays have attracted attention as the next-generation flat display panels. The organic EL displays have such advantages as self-luminescence, wide viewing angle, high-contrast image, thin profile, lightweight, and low power consumption.

Each of the organic EL devices that constitute an organic EL display generally includes an anode, a cathode, and organic layers disposed between the anode and cathode. The organic layers are composed of a light-emitting layer containing fluorescent molecules, and an electron conductive layer and a hole conductive layer which sandwich the light-emitting layer. Application of a voltage between the cathode and the anode causes the injection of electrons into the electron conductive layer from the cathode and the injection of holes into the hole conductive layer from the anode, with the result that the electrons and holes are recombined in the light-emitting layer to cause luminescence.

A manufacturing method of an organic EL display includes lamination of organic layers and thin-film electrodes, thicknesses of which are of the order of several tens of nanometers. This lamination process is conducted in a clean room. Nevertheless, it is not possible to completely rid the clean room of foreign material such as a particle derived from an organic layer manufacturing machine or other device or from the surrounding environment. For this reason, foreign material may be incorporated into the organic layer during manufacturing of an organic EL display.

When a voltage is applied between the anode and cathode in a state where the organic layer is contaminated with foreign material, it results in current leakage between the electrodes via the foreign material. Once current leakage occurred, more current is needed to make the organic layer luminescent, resulting in high power consumption and low luminescence efficiency.

Known techniques for preventing possible current leakage via foreign material incorporated into the organic layer include a laser repair method (see, e.g., Patent Literatures 1 to 10). The laser repair method is a process whereby current leakage via foreign material is prevented by laser irradiation of a portion (hereinafter also referred to as a "defect") of organic layer contaminated with foreign material. Since the laser repair method involves high-energy laser irradiation, it may also thermally damage the surrounding region of the laser-irradiated region of organic layer; therefore, a larger area of organic layer may be destroyed than necessary. Moreover, the laser repair method suffers from a problem that it may destroy a protective layer for the organic layer, allowing oxygen and water to migrate into the organic layer to cause degradation of the light-emitting layer, which leads to generation of dark spots.

In an effort to overcome these drawbacks, several laser repair methods have been proposed whereby defects are selectively destroyed so that possible damage to portions of organic layer other than the defects can be avoided (see, e.g., Patent Literatures 11 and 12).

Patent Literature 11 discloses a laser irradiation method in which a weak laser beam is applied to the organic layer at the surrounding region of a defect rather than directly to the defect. When the surrounding region of a defect is irradiated with a laser beam, the energy of the laser beam propagates from the laser-irradiated region to the defect, forming a high-resistance region in the defect and preventing current leakage between the anode and cathode via the defect.

Patent Literature 12 discloses a method in which a laser beam is applied to a defect present in the organic layer or anode so that multi-photon absorption occurs exclusively at the defect. This makes it possible to destroy defects for avoiding current leakage between the anode and cathode via the defects, while reducing damage to regions other than the defect.

CITATION LIST

Patent Literature

[PTL 1] Japanese Patent Application Laid-Open No. 2006-221982
[PTL 2] Japanese Patent Application Laid-Open No. 2006-269108
[PTL 3] Japanese Patent Application Laid-Open No. 2002-260857
[PTL 4] Japanese Patent Application Laid-Open No. 2005-276600
[PTL 5] Japanese Patent Application Laid-Open No. 2009-16195
[PTL 6] U.S. Patent Application Publication No. 2006/0214575
[PTL 7] U.S. Patent Application Publication No. 2006/0178072
[PTL 8] U.S. Patent Application Publication No. 2005/0215163
[PTL 9] U.S. Patent Application Publication No. 2002/0142697
[PTL 10] U.S. Patent Application Publication No. 2006/0178072
[PTL 11] Japanese Patent Application Laid-Open No. 2004-227852
[PTL 12] Japanese Patent Application Laid-Open No. 2008-235178

SUMMARY OF INVENTION

Technical Problem

However, a high-resistant region formed in a defect by laser irradiation of the organic layer at the surrounding region of the defect as disclosed in Patent Literature 11 has a larger area than the defect. The area of the non-luminescent region of the organic layer increases with increasing area of the high-resistant region, and therefore, brightness reduction in the sub-pixel containing the defect becomes so significant that color unevenness occurs.

Moreover, when a laser beam passes through a color filter, there is a possibility of ablation of a portion of the color filter through which the laser beam passed. Thus, with the method disclosed by Patent Literature 11, there is concern that a color filter may be ablated at the surrounding region of defects. As color filters serve to ensure color reproducibility for organic EL displays, there is also concern that the method disclosed by Patent Literature 11 reduces color reproducibility at the surrounding region of defects.

On the other hand, since the method disclosed by Patent Literature 12 directly applies a laser beam to foreign material in the organic layer, the organic layer is largely damaged.

Thus, with this method, there is concern that a larger area of the organic layer is destroyed than necessary. Moreover, since a laser beam is perpendicularly incident on the panel with the method disclosed by Patent Literature 12, foreign material receives much laser light, and therefore the foreign material is severely damaged. For this reason, laser irradiation tends to destroy foreign material itself. There is concern that pieces of destroyed foreign material scatter toward the transparent cathode to generate additional defects in the organic EL display. Further, when a laser beam is vertically incident on the panel, the anode and TFT under the organic layer are also damaged.

With the method disclosed by Patent Literature 12, there is also a possibility of ablation of a portion of a color filter through which a laser beam passed. Thus, there is concern that a portion of the color filter directly above a defect may be ablated. Accordingly, the method disclosed by Patent Literature 12 suffers from the limitation that it significantly reduces color reproducibility at defects.

It is therefore an object of the present invention to prevent current leakage via defects without damaging organic layers, and to provide a manufacturing method of an organic EL display that offers high color reproducibility.

Solution to Problem

The inventor found that application of a laser beam at an angle with respect to the normal to the display surface of an organic EL panel makes it possible to destroy a portion of a transparent cathode directly above a defect without damaging the organic layer, and that color reproducibility reduction can be prevented even when a portion of a color filter is ablated. With additional studies, the inventor completed the present invention.

That is, a first aspect of the present invention concerns manufacturing methods of an organic EL display given below.

[1] A method of manufacturing an organic EL display including:

providing an organic EL panel having a substrate and a plurality of organic EL devices disposed on the substrate in a matrix arrangement, each of the organic EL devices including a pixel electrode disposed over the substrate, an organic layer disposed over the pixel electrode, a transparent counter electrode disposed over the organic layer, a sealing layer disposed over the transparent counter electrode, and a color filter disposed over the sealing layer;

detecting a defect present in the organic layer of the organic EL device; and destroying a portion of the transparent counter electrode directly above the defect by application of a laser beam, wherein the laser beam is applied at an angle with respect to the normal to a display surface of the organic EL panel.

[2] The method according to [1], wherein when the diameter of a laser irradiation region of the transparent counter electrode is "x", the thickness of the sealing layer is "y" and the incident angle of the laser beam is "θ", x, y and θ satisfy the relationship $\theta \geq \tan^{-1}(x/y)$.

[3] The method according to [1] or [2], wherein when the thickness of the color filter is "t", the diameter of the laser beam passing through the color filter is not greater than 0.7 t, and the incident angle of the laser beam is equal to or larger than 45°.

[4] The method according to any one [1] to [3], wherein the organic EL device further includes a bank for defining the organic layer, the color filter is also disposed over the bank, and the laser beam passes through a region of the color filter directly above the bank.

[5] The method according to any one of [1] to [4], further including disposing a prism on the organic EL panel, wherein the laser beam passes through the prism.

[6] The method according to [5], wherein the prism is an isosceles right triangle prism.

[7] The method according to any one of [1] to [4], further including disposing a liquid droplet on the organic EL panel, wherein the laser beam passes through the liquid droplet.

[8] The method according to any one of [1] to [7], wherein the laser beam has a wavelength of 400 nm or less.

A second aspect of the present invention concerns organic EL displays given below.

[9] An organic EL display including:

a substrate; and a plurality of organic EL devices disposed on the substrate in a matrix arrangement, each of the organic EL devices including a pixel electrode disposed over the substrate, an organic layer disposed over the pixel electrode, a transparent counter electrode disposed over the organic layer, a sealing layer disposed over the transparent counter electrode, and a color filter disposed over the sealing layer, wherein at least one of the organic EL devices has a defect in the organic layer, a portion of the transparent counter electrode directly above the defect is destroyed, a portion of the color filter included in the organic EL device having the defect is removed, and a region of the color filter directly above the destroyed portion of the transparent counter electrode and the removed portion of the color filter are positioned at different locations.

[10] The organic EL display according to [9], wherein the organic EL device further includes a bank for defining the organic layer, the color filter is also disposed over the bank, and the removed portion of the color filter is positioned directly above the bank Advantageous Effects of Invention According to the present invention, since a laser beam is incident at an angle with respect to the normal to the display surface of an organic EL panel upon laser irradiation of a transparent cathode directly above a defect, less damage is imparted to layers underneath the transparent cathode (e.g., organic layer, anode, and TFT) and to the defect (e.g., foreign material); therefore, the defect never enlarges due to laser irradiation.

Moreover, by applying a laser beam at an angle with respect to the normal to the display surface of an organic EL panel, even when a portion of a color film is ablated with laser irradiation, a region of the color filter directly above the destroyed portion of the transparent cathode and the ablated portion of the color filter are positioned at different locations (see FIGS. 4A and 4B). With this configuration, it is possible to avoid reduction in color reproducibility at the defect (see Embodiment 1).

DESCRIPTION OF EMBODIMENTS

Figure 1A:
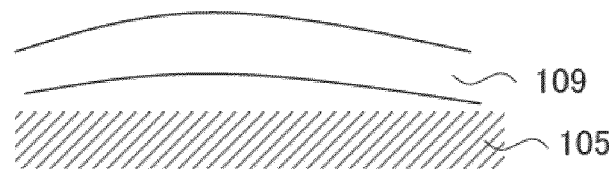
FIGS. 1A to 1C illustrate a transparent counter electrode destroyed by laser irradiation.

1. Manufacturing Method of Organic EL Display

Effects of the present invention are exhibited particularly for the manufacture a large-screen organic EL display. The reason for this is that since it is highly likely that foreign material such as a particle is incorporated into the organic layer during manufacturing of a large-screen organic EL display, it is highly necessary to prevent current leakage via the defect with the method of the present invention.

A manufacturing method of an organic EL display includes 1) a first step of providing an organic EL panel; 2) a second step of detecting a defect in an organic layer of an organic EL device constituting the organic EL panel; and a third step of destroying a portion of a transparent counter electrode directly above the defect by laser irradiation. Each step will be described in detail below.

1) In the first step, an organic EL panel is provided. The organic EL panel provided in the first step is of the top-emission type. The organic EL panel includes a substrate and organic EL devices disposed on the substrate in a matrix arrangement. Each organic EL device includes a pixel electrode disposed over the substrate, an organic layer disposed over the pixel electrode, a transparent counter electrode disposed over the organic layer, a sealing layer disposed over the transparent counter electrode, and a color filter disposed over the sealing layer. The organic EL device may further include a bank for defining the organic layer. When the organic EL device includes a bank, the color filter is disposed over the bank. In the present invention, the organic EL devices serve as sub-pixels in an organic EL display.

The organic EL panel may include sealing glass disposed over the color filter of the organic EL device.

The organic layer of the organic EL device may be formed using either vapor deposition or coating techniques. For manufacturing a large-screen organic EL display, the organic layer is preferably formed using coating technique; examples include inkjet printing, dispensing, nozzle coating, spin coating, intaglio printing, and relief printing.

A controlling ability of a film thickness of the order of several tens of nanometers is required of these coating techniques. Although it is typical that the manufacturing environment is well managed and manufacturing equipment is well maintained for the preparation of organic layer using coating techniques, foreign material may be incorporated into the organic layer (see FIGS. 2A and 2B).

On the other hand, when vapor deposition is employed, there is concern that foreign material such as a particle derived from a metal mask may be incorporated in the organic layer. Thus, even when vapor deposition is employed, it is effective to prevent current leakage via defects by means of the method of the present invention.

The following describes the second and third steps for preventing current leakage through a portion (hereinafter also referred to as a "defect") of an organic layer contaminated with such foreign material.

Figure 2A:
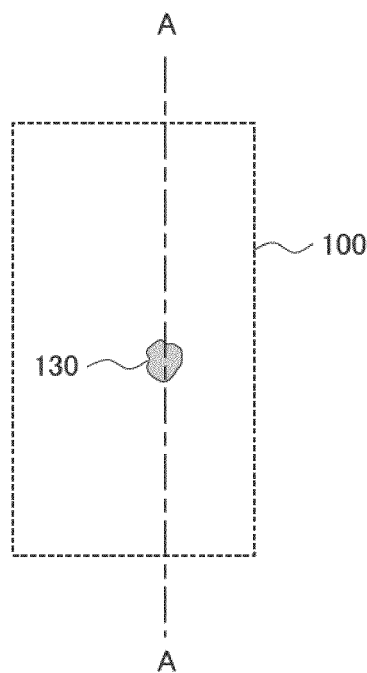
FIGS. 2A and 2B illustrate an organic EL device in a manufacturing process of an organic EL display according to Embodiment 1.
Figure 2B:
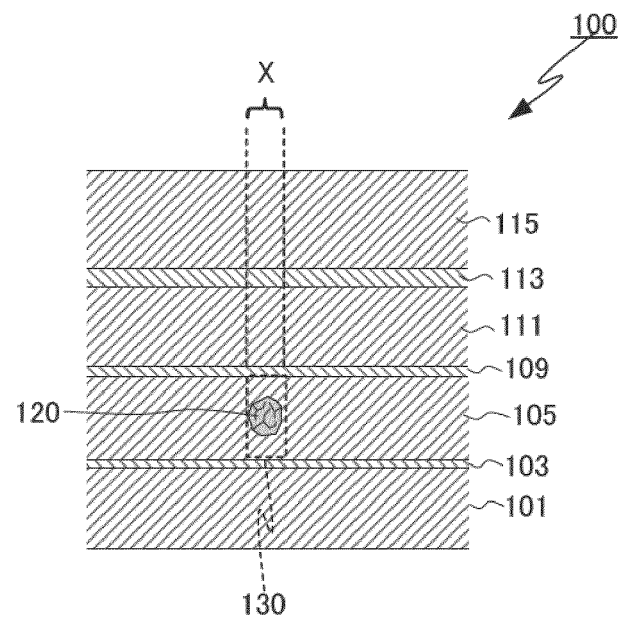

2) In the second step, a defect—a portion of an organic layer of an organic EL device contaminated with foreign material such as a particle—is detected (see FIGS. 2A and 2B). There are no particular limitations on the defect detection method; examples include visual inspection for foreign material, and detection of leak light from the organic EL panel, the leak light is emitted as a result of application of a reverse bias voltage or a forward bias voltage equal to or less than electroluminescence voltage to the organic EL panel.

3) In the third step, a portion of a transparent counter electrode directly above a defect is destroyed by laser irradiation (hereinafter may simply expressed as "a transparent counter electrode is destroyed"). This forms a destroyed region in the transparent counter electrode (hereinafter may simply referred to as a "destroyed portion").

A laser beam is applied through the color filter and sealing layer to the transparent counter electrode at a position directly above a defect. There are no particular limitations on the position of the organic EL panel at which a laser beam is incident. However, in the case where the organic EL panel includes a bank, a laser beam is preferably incident on the organic EL panel so as to pass through a color filter over the bank (see Embodiment 3).

Figure 1B:
Figure 1C:
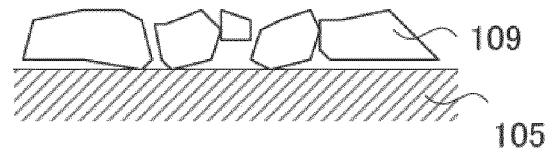

As used herein, the expression "a laser beam is applied to a transparent counter electrode" means to focus a laser beam on a transparent counter electrode. As used herein, the expression "destroy a transparent counter electrode" means to destroy the function of a transparent counter electrode, i.e., to impede current flow through the electrode. More specifically, the expression "destroy a transparent counter electrode" means to impede current flow through a laser-irradiated portion of a transparent counter electrode via a defect either by 1)

forming space between the laser-irradiated portion of transparent counter electrode 109 and organic layer 105 (see FIG. 1A), 2) degenerating the laser-irradiated portion of transparent counter electrode 109 to create a crack (see FIG. 1B), or 3) crashing the laser-irradiated portion of transparent counter electrode 109 (see FIG. 1C).

Laser irradiation sometimes causes the ablation of a color filter through which a laser beam passed. Hereinafter, an ablated region of a color filter may be simply referred to as an "ablated portion."

In addition, in the present invention, a sealing layer is disposed on the transparent counter electrode. Accordingly, even when the transparent counter electrode has been destroyed, pieces of the destroyed transparent counter electrode are blocked by the sealing layer. Therefore, scattering of the pieces of the destroyed transparent counter electrode hardly occurs in the present invention. Thus, pieces of a destroyed transparent counter electrode do not contribute to creation of additional defects in the organic EL display.

By destroying a region of a transparent counter electrode directly above a defect in this way, it is possible to prevent possible current leakage via the defect. Although the defect becomes non-luminescent, the organic EL device's function is maintained. It is thus possible to maintain brightness of pixels having a defect, as well as to improve luminous efficiency and power consumption.

The laser irradiation region of the transparent counter electrode is preferably 20 to 50% larger than the defect detected in the second step. When the defect has been detected based on leak light, the laser irradiation region of the transparent counter electrode may be made identical in size to the light leak region. The size of the laser irradiation region can be adjusted by means of a slit provided in the laser source. A slit refers to a member for changing the length or width of a laser beam spot. The usage of a slit allows for defect-size dependent adjustment of the size of a laser irradiation region of the transparent counter electrode.

There are no particular limitations on the laser source used for laser irradiation; examples include flash lamp-pumped Nd:YAG laser. When the Nd:YAG laser is used, the wavelength of the laser beam can be selected from 1,064 nm (fundamental), 532 nm (second harmonics), 355 nm (third harmonics), and 266 nm (fourth harmonics) wavelengths.

The wavelength of a laser beam applied to a transparent counter electrode is preferably determined depending on the color of a color filter at which the laser beam is incident. It is preferably 1,100 nm or less, most preferably 400 nm or less. That is, when using the Nd:YAG laser, the third or fourth harmonics wavelength may be employed. Laser beams with a wavelength of 400 nm or less have less influence on the organic layer provided below the transparent counter electrode.

The energy (energy density) of laser beam is adjusted such that the transparent counter electrode can be destroyed; the energy of laser beam applied to the transparent counter electrode is determined depending on the material or thickness of the transparent counter electrode.

For example, when a transparent counter electrode composed of ITO having 100 nm thickness is to be destroyed with the Nd:YAG laser, it is preferable to employ the third harmonics wavelength (355 nm) and to set the energy density at 0.05 to 0.15 J/cm$^2$.

The present invention is characterized in that in the third step a laser beam is applied at an angle with respect to the normal to the display surface of an organic EL panel. Namely, the present invention is characterized in that the incident angle of a laser beam with respect to the display surface of an organic EL panel is larger than 0°. It is preferable that the laser beam incident angle be appropriately determined depending on the diameter of a laser irradiation region (region to be destroyed) of the transparent counter electrode and on the sealing layer thickness. In other words, since the diameter of a laser irradiation region is determined depending on the size of a defect as described above, the laser beam incident angle is appropriately determined depending on the defect size and the sealing layer thickness.

More specifically, when the diameter of a laser irradiation region of a transparent counter electrode (hereinafter may be simply referred to as a "irradiation diameter") is "x" and the sealing layer thickness is "y," incident angle θ preferably satisfies the following condition:

$$\theta \geq \tan^{-1}(x/y)$$

Thus, for example, when irradiation diameter x is 5 μm and sealing layer thickness y is 10 μm, laser beam incident angle θ is preferably set to approximately 27° or larger. Appropriate adjustment of the laser beam incident angle may be accomplished by tilting either the laser beam outlet or organic EL panel.

When laser beam incident angle θ becomes too large, prisms or liquid droplets may be disposed on a region of the surface layer (generally sealing glass) of the organic EL panel, the region at which laser beam is incident.

As described above, since a laser beam is incident at an angle with respect to the normal to the display surface of an organic EL panel upon laser irradiation of a transparent counter electrode, it is possible to reduce damage to layers (e.g., organic layer, anode and TFT) underneath the transparent counter electrode and to the defect (e.g., foreign material). Thus, in the present invention, laser irradiation does not causes enlargement of defects.

Figure 4A:
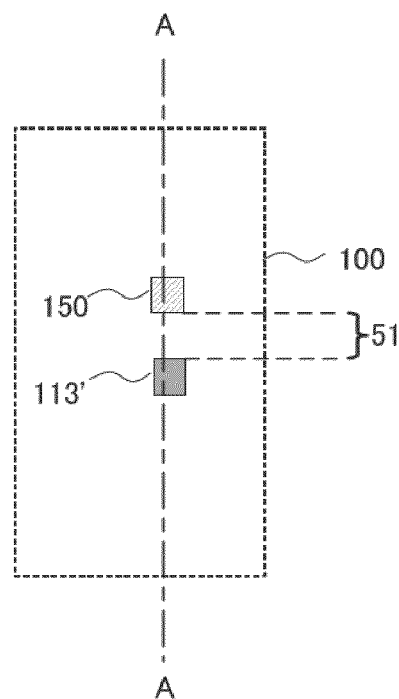
FIGS. 4A and 4B illustrate an organic EL device in an organic EL display manufactured by the manufacturing method according to Embodiment 1.
Figure 4B:
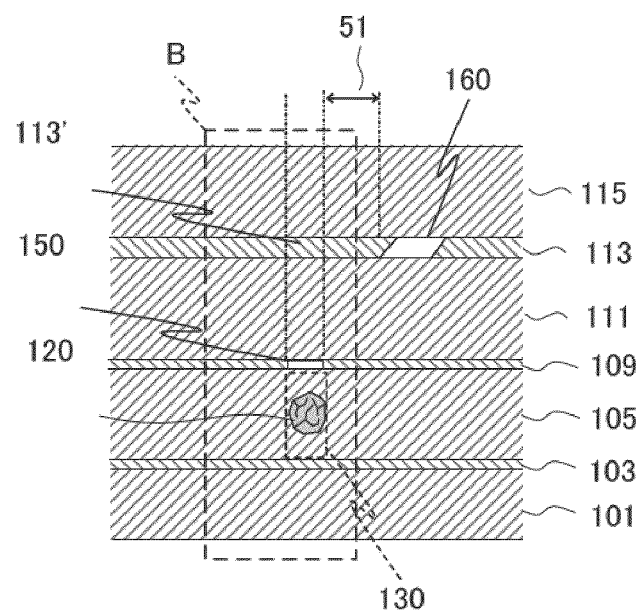

Moreover, by setting laser beam incident angle θ to equal to or larger than $\tan^{-1}(x/y)$, even when a portion of a color filter has been ablated with laser irradiation, a region of the color filter directly above the destroyed portion of the counter electrode and the ablated portion of the color filter are positioned at different locations (see FIGS. 4A and 4B). This maintaining a color filter directly above the defect prevents reduction in color reproducibility at a position corresponding to the defect.

2. Organic EL Display

An organic EL display of the present invention is manufactured by the above-described manufacturing method of the present invention. The organic EL display of the present invention is of the top-emission type, and includes a substrate and organic EL devices disposed on the substrate in a matrix arrangement.

Each organic EL device includes a pixel electrode disposed over the substrate, an organic layer disposed over the pixel electrode, a transparent counter electrode disposed over the organic layer, a sealing layer disposed over the transparent counter electrode, and a color filter disposed over the sealing layer. The organic EL device may further include a bank for defining the organic layer. When the organic EL device includes a bank, the color filter is disposed over the bank. The organic EL display is sealed by means of sealing glass disposed over the color filter.

The substrate is an insulating plate. The substrate may incorporate therein a thin-film transistor (TFT) for each sub-pixel. When TFTs are incorporated into the substrate, each sub-pixel is connected with TFT through a contact hole The pixel electrode is an electrically conductive member disposed over the substrate. The pixel electrode generally serves as an anode, but may serve as a cathode. The pixel electrode preferably has light reflectivity. Examples of materials of the pixel electrode include APC alloys (silver-palladium-copper alloys), ARA alloys (silver-ruthenium-gold alloys), MoCr alloys (molybdenum/chrome alloys), and NiCr alloys (nickel/chrome alloys). The pixel electrode may be connected to the drain electrode or source electrode of a TFT through a contact hole.

The organic layer includes an organic light-emitting layer containing organic luminescent material. Organic luminescent material contained in the organic light-emitting layer is preferably polymeric organic luminescent material so that the layer can be formed by coating techniques. Examples of polymeric organic luminescent material include polyphenylenevinylene and its derivatives, polyacetylene and its derivatives, polyphenylene and its derivatives, poly para-phenylene ethylene and its derivatives, poly(3-hexylthiophene) and its derivatives, and polyfluorene and its derivatives.

The organic luminescent layer emits red, green or blue light depending on the position of the organic EL device. The organic layer may further include a hole injection layer, a hole transport layer, an electron transport layer, and the like.

The bank is an insulating barrier for defining the organic layer. The bank may be formed by patterned by exposure and development of a resist material composed of a photosensitive material.

The transparent counter electrode is a transparent electrically conductive member disposed over the organic layer. The counter electrode generally serves as a cathode, but may also serve as an anode. Examples of materials of the transparent counter electrode include ITO and IZO. The transparent counter electrode is about 100 nm in thickness. The organic EL display of the present invention is characterized in that portions of the transparent counter electrode directly above defects present in the organic layer are selectively destroyed.

The sealing layer is a member for protecting the organic layer against water and oxygen. Examples of materials of the sealing layer include inorganic materials such as silicon nitrides (SiNx) and organic materials such as UV curable resins.

The color filter is a layer for selectively allowing light of specific wavelength emitted from the organic layer to pass through. By allowing the light emitted from the organic layer to pass through the color filter, high color reproducibility is attained.

The color of the color filter is appropriately determined depending on the color of light an organic EL device emits. More specifically, an organic EL device for emitting red light includes a red color filter; an organic EL device for emitting green light includes a green color filter; and an organic EL device for emitting blue light includes a blue color filter. Examples of materials of the color filter include color resists. The color filter is about 1 μm in thickness.

The present invention is characterized in that a portion of a color filter is removed. It is also preferable in the present invention that a region of a color filter directly above a destroyed portion of a counter electrode and a removed portion (ablated portion) of the color filter are positioned at different locations (see Embodiment 1, and FIGS. 4A and 4B).

Figure 12A:
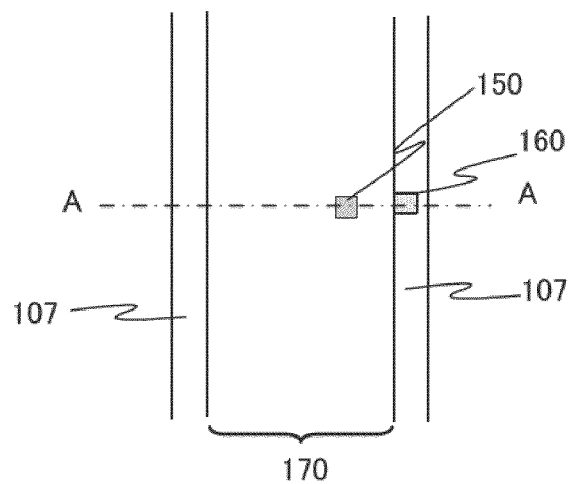
FIGS. 12A and 12B illustrate an organic EL device in an organic EL display manufactured by the manufacturing method according to Embodiment 3.
Figure 12B:
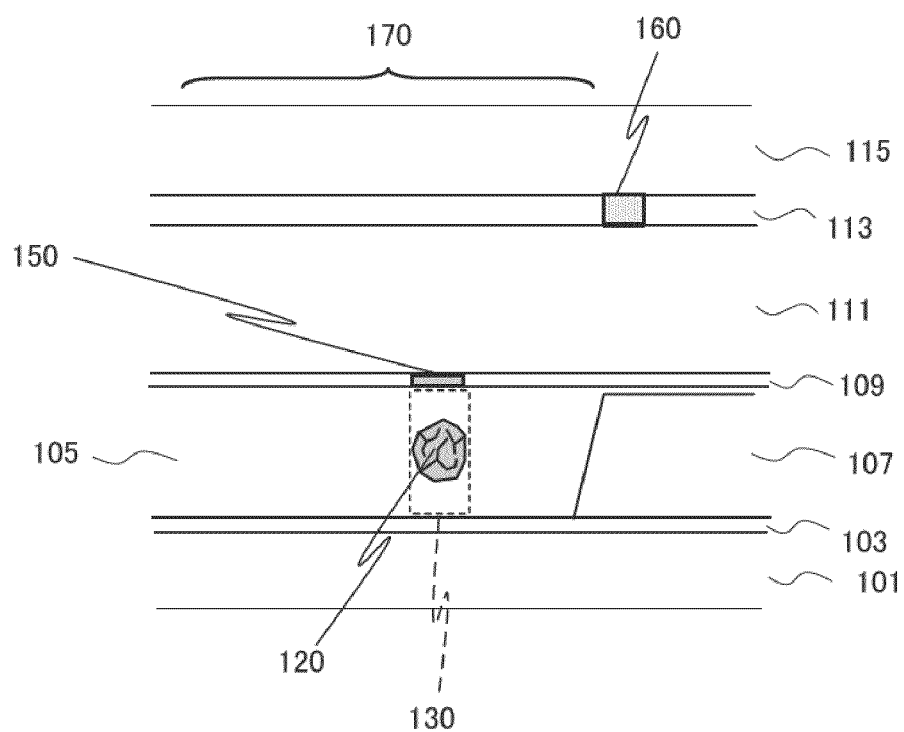

Moreover, when an organic EL device includes a bank, an removed portion of the color filter is preferably positioned directly above the bank (see Embodiment 3, and FIGS. 12A and 12B).

Hereinafter, embodiments of the manufacturing method of an organic EL display of the present invention will be described with reference to the accompanying drawings. The embodiments given below are directed to a third step (a step of destroying a transparent counter electrode) following a second step of detecting a defect in an organic layer of an organic EL device.

Embodiment 1

FIG. 2A is a plan view of organic EL device 100 having a defect which has been detected in the second step (a step of detecting a defect in an organic layer of an organic EL device). FIG. 2B is a sectional view of organic EL device 100 in FIG. 2A taken along dashed dotted line AA.

As illustrated in FIG. 2B, organic EL device 100 includes substrate 101, pixel electrode 103, organic layer 105, transparent counter electrode 109, sealing layer 111, color filter 113, and sealing glass 115. Organic layer 105 has foreign material 120, and the region of organic layer 105 contaminated with foreign material 120 constitutes defect 130.

Figure 3A:
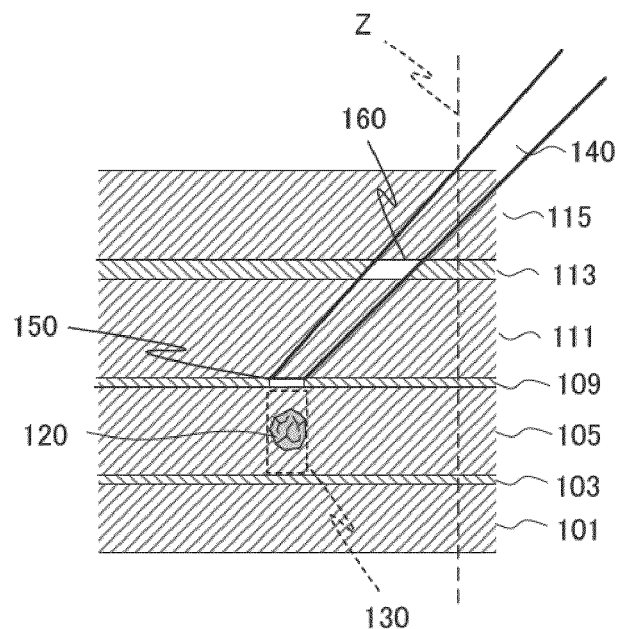
FIGS. 3A and 3B illustrate a part of a manufacturing method according to Embodiment 1.

FIG. 3A illustrates the third step (a step of destroying a transparent counter electrode) in Embodiment 1. As illustrated in FIG. 3A, in the third step of this embodiment, laser beam 140 is focused on a region of transparent counter electrode 109 directly above defect 103. As illustrated in FIG. 3A, laser beam 140 is incident at an angle with respect to normal Z to the panel's display surface.

The wavelength of laser beam 140 to be applied to transparent counter electrode 109 is preferably determined depending on the color of color filter 113 at which laser beam 140 is incident. When color filter 113 is red, it shows high light transmittance at 600 mn or higher. When color filter 113 is green, it shows high light transmittance in the range of 480 nm to 580 nm and 790 nm or higher. When color filter 113 is blue, it shows high light transmittance in the range of 430 nm to 550 nm and 800 nm or higher. Thus, selection of such a wavelength that allows laser beam 140 to easily pass through color filter 113 is more preferable in terms of selectively destroying a portion of the transparent counter electrode without causing the ablation of color filter 113 through which laser beam 140 passed.

Figure 3B:
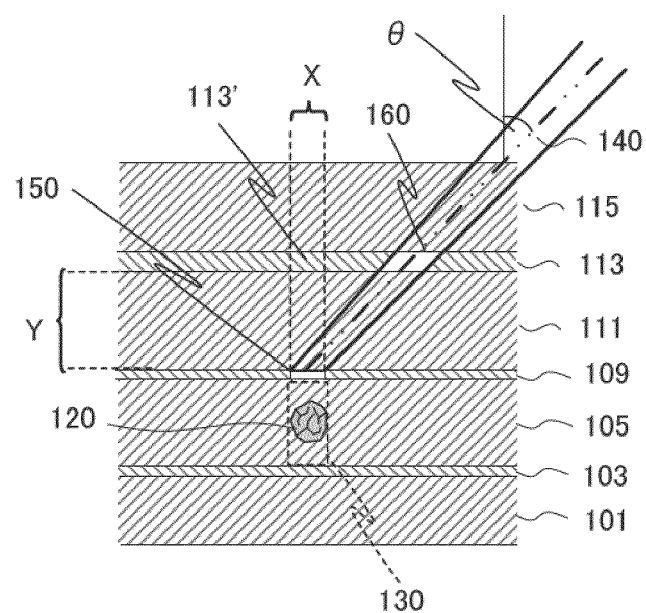

FIG. 3B illustrates an incident angle of laser beam 140. When the incident angle of laser beam 140 is "θ", irradiation diameter is "x," and the thickness of sealing layer 111 is "y" as illustrated in FIG. 3b, θ, x and y preferably satisfy the following relationship:

$$\theta \geq \tan^{-1}(x/y)$$

Thus, for example, when irradiation diameter x is 5 μm and sealing layer thickness y is 10 μm, laser beam incident angle θ is preferably set to approximately 27° or larger. Appropriate adjustment of laser beam incident angle may be accomplished by tilting either the laser beam outlet or organic EL panel.

Application of laser beam 140 destroys a portion of transparent counter electrode 109 directly above defect 130, forming destroyed portion 150 in transparent counter electrode 109. Application of laser beam 140 may also form ablated portion 160 in color filter 113.

However, by setting incident angle θ of laser beam 140 to equal to or larger than $\tan^{-1}(x/y)$, even when laser beam 140 ablated a portion of color filter 113, region 113' of color filter 113 directly above destroyed portion 150 of transparent counter electrode 109 and ablated portion 160 of color filter 113 are positioned at different locations (see FIGS. 4A and 4B).

Thus, according to this embodiment, by applying a laser beam to the transparent counter electrode at an angle with respect to the normal to the organic panel's display surface, it is possible to reduce damage to foreign material due to laser irradiation. This impedes destruction of foreign material and thus prevents enlargement of defect.

FIG. 4A is a plan view of organic EL device 100 repaired through the third step. FIG. 4B is a sectional view of organic EL device 100 in FIG. 4A taken along dashed dotted line AA. As illustrated in FIGS. 4A and 4B, organic EL device 100 has destroyed portion 150 of transparent counter electrode 109 and ablated portion 160 of color filter 113. In color filter 113, region 113' directly above destroyed portion 150 and ablated portion 160 are positioned at different locations, forming gap 51 between the two regions.

According to this embodiment, since region 113' of color filter 113 directly above the destroyed portion of the transparent counter electrode and ablated portion 160 of color filter 113 are positioned at different locations, it is possible to prevent reduction in color reproducibility at a position corresponding to defect 130. With reference to the drawings, the following describes how color reproducibility reduction at defect 130 is prevented by positioning color filter region 113' and ablated portion 160 of color filter 113 at different locations.

Figure 5A:
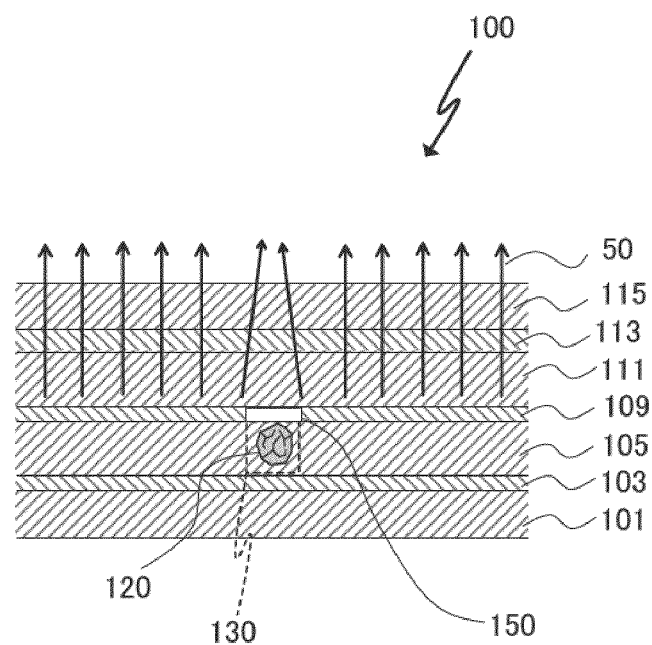
FIGS. 5A and 5B illustrate a luminescent state of an organic EL device in an organic EL display manufactured by the manufacturing method according to Embodiment 1.

FIG. 5A is an enlarged view of square B illustrated in FIG. 4B. FIG. 5A also illustrates a luminescent state of organic EL device 100. Arrows 50 in FIG. 5A indicate beams of light emitted from organic layer 105.

Since a portion of transparent counter electrode 109 directly above defect 130 is destroyed as described above, defect 130 is a non-luminescent region. Thus, defect 130 does not emit light by itself; however, beams of light emitted from the surrounding region of defect 130 of organic layer 105 is spread into the region directly above defect 130. Thus, light can also be taken out from a region corresponding to defect 130, a non-luminescent region. Moreover, as color filter 130 is left directly above defect 130, beams of light traveling directly above defect 130 can pass through color filter 130. This makes it possible to ensure color reproducibility of light taken out from a region directly above defect 130, reducing the contrast between the light from defect 130 and the light from the surrounding region of defect 130. This reduces color unevenness.

Figure 5B:
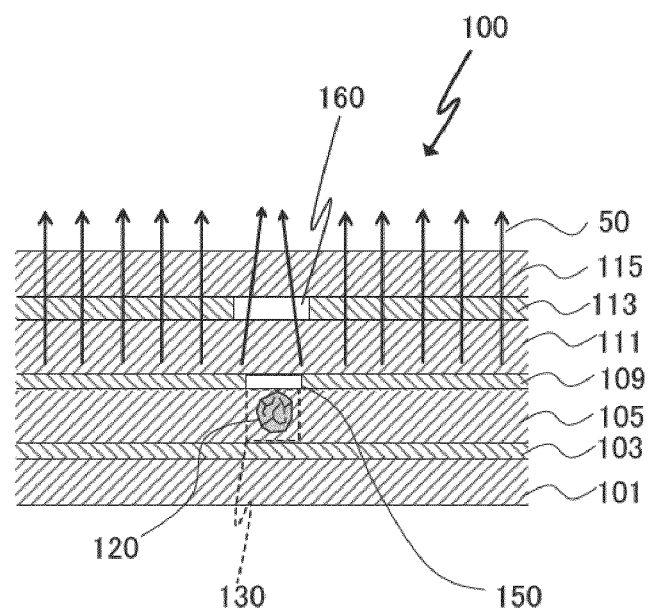

On the other hand, when a laser beam is perpendicularly incident on the panel's display surface as with the conventional laser repair method, ablated portion 160 of color filter 113 is positioned directly above defect 130, as illustrated in FIG. 5B. Specifically, color filter 113 is ablated at a position directly above defect 130. With this configuration, beams of light spread into the region directly above defect 130 from the surrounding region is taken out without passing through color filter 113. This increases the contrast between the light from the region directly above defect 130 and the light from the surrounding region of defect 130, resulting in significant color unevenness.

Embodiment 2

The method of Embodiment 1 can prevent color reproducibility reduction at a position corresponding to a destroyed portion of a counter electrode, but cannot prevent color reproducibility reduction at a position corresponding to an ablated portion of a color filter. Embodiment 2 describes a method for preventing color reproducibility reduction not only at a position corresponding to a destroyed portion of a counter electrode, but also at a position corresponding to an ablated portion of a color filter.

Figure 6A:
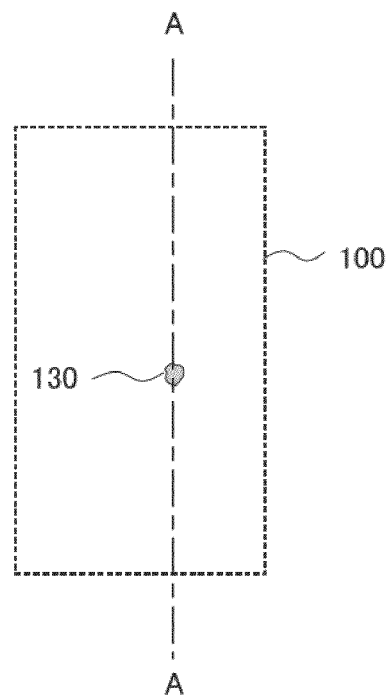
FIGS. 6A and 6B illustrate an organic EL device in a manufacturing process of an organic EL display according to Embodiment 2.
Figure 6B:
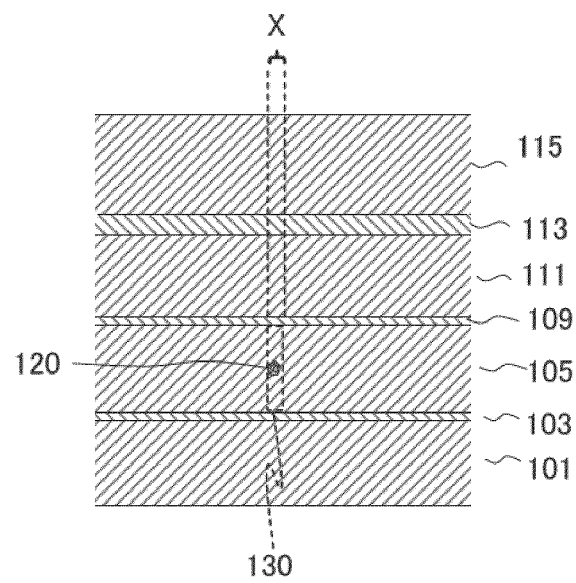

FIG. 6A is a plan view of organic EL device 100 having a defect which has been detected in the second step (a step of detecting a defect in an organic layer of an organic EL device) of the manufacturing method of the present invention. FIG. 6B is a sectional view of organic EL device 100 in FIG. 6A taken along dashed dotted line AA. The same components as those in Embodiment 1 are not described herein.

As illustrated in FIGS. 6A and 6B, organic layer 105 of organic EL device 100 includes foreign material 120, and the region of organic layer 105 contaminated with foreign material 120 constitutes defect 130. In this embodiment, the color filter thickness is assumed to be 1 μm, and diameter x of a region of transparent counter electrode 109 directly above defect 130 is assumed to be 1 μm or less.

Figure 7A:
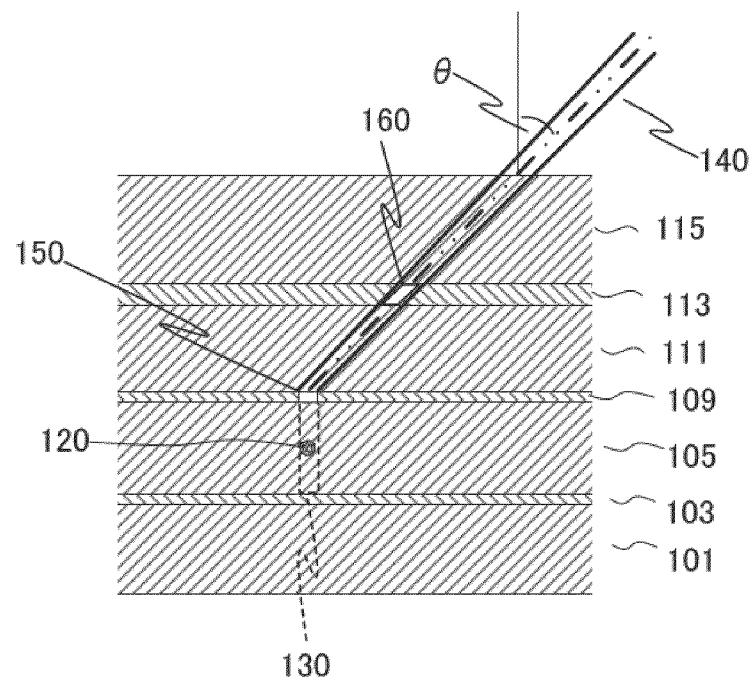
FIGS. 7A and 7B illustrate a part of a manufacturing method according to Embodiment 2.
Figure 7B:
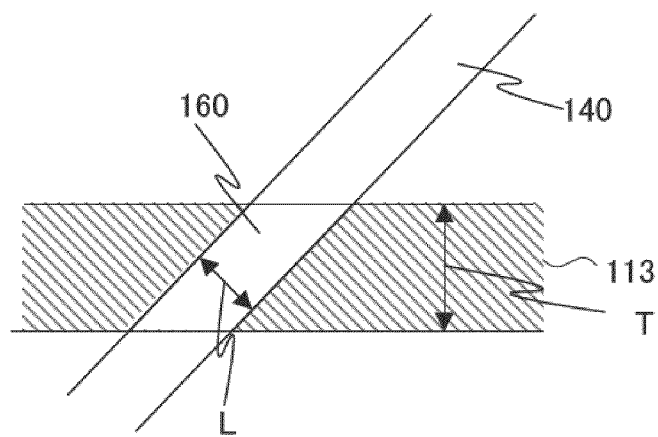

FIG. 7A illustrates a third step in Embodiment 2. FIG. 7B is an enlarged view of a laser beam passing through a color filter. As illustrated in FIG. 7A, in the third step of this embodiment, laser beam 140 is focused on a region of transparent counter electrode 109 directly above defect 130.

In this embodiment, incident angle θ of laser beam 140 is set to 45° or larger in order to prevent color reproducibility reduction at a position corresponding to an ablated portion of color filter 113. In this embodiment, as illustrated in FIG. 7B, diameter L of laser beam 140 upon passing through color filter 113 is set to not greater than 0.7 times the thickness (T) of color filter 113. Specifically, diameter L of laser beam 140 upon passing through color filter 113 is 0.7 μm or less. This laser irradiation condition is preferable particularly when the defect size is equal to or less than the color filter's thickness.

By setting incident angle θ of laser beam 140 to 45° or larger and setting diameter L of laser beam 140 upon passing through color filter 113 to not greater than 0.7 times the thickness (T) of color filter 113 in this way, the opening of ablated portion 160 on the top side of color filter 113 and the opening of ablated portion 160 on the bottom side of color filter 113, which will be described later, do not overlap (see FIG. 8A).

As used herein, the term "top side of color filter" means, among the two sides of a color filter, the side that is on the same side as the laser source, and the term "bottom side of color filter" means, among the two sides of a color filter, the side that is on the opposite side from the laser source.

Laser beam 140 is applied to transparent counter electrode 109 through color filter 113 and sealing layer 111. Application of laser beam 140 destroys a portion of transparent counter electrode 109 directly above a defect, forming destroyed portion 150 in transparent counter electrode 109. Application of laser beam 140 also results in the formation of ablated portion 160 in color filter 113.

Figure 8A:
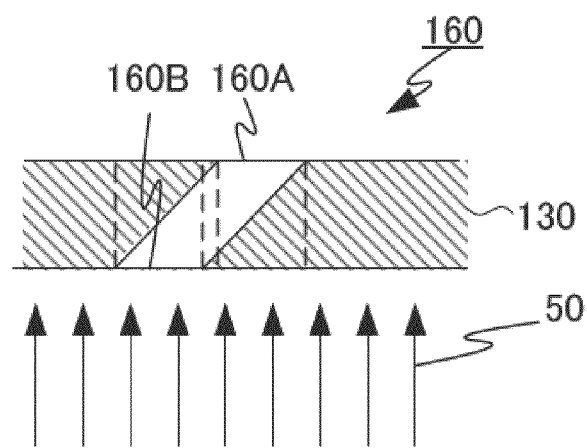
FIGS. 8A and 8B illustrate a luminescent state of an organic EL device in an organic EL display manufactured by the manufacturing method according to Embodiment 2.

FIG. 8A is an enlarged view of ablated portion 160 of color filter 113. In this embodiment, by setting incident angle θ of laser beam 140 to 45° or larger and setting diameter L of laser beam 140 passing through color filter 113 to not greater than 0.7 times the thickness (T) of color filter 113, opening 160A of ablated portion 160 on the top side of color filter 113 and opening 160B of ablated portion 160 on the bottom side of color filter 113 do not overlap, as illustrated in FIG. 8A. With this configuration, all of the beams of light 50 emitted from organic layer 105 can pass through at least a portion of color filter 113.

Thus, according to this embodiment, it is possible to provide an organic EL display that offers high color reproducibility not only at a destroyed portion of a counter electrode, but also at an ablated portion of a color filter.

Figure 8B:
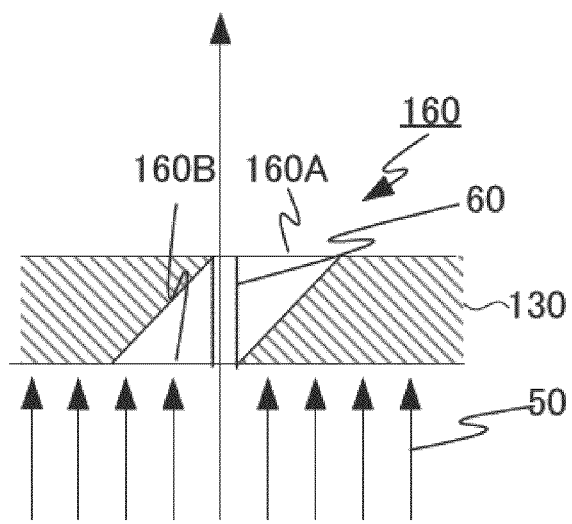

On the other hand, when the laser beam incident angle is below 45° and/or the diameter of laser beam passing through a color filter is greater than 0.7 times the thickness (T) of the color filter in the third step, ablated portion 160 of color filter 113 has overlapping region 60 in which opening 160A on the top side of color filter 113 and opening 160B on the bottom side of color filter 113 overlap, as illustrated in FIG. 8B. Thus, some of the beams of light 50 emitted from organic layer 105 do not pass through color filter 113, resulting in reduced color reproducibility at some points.

Embodiment 3

Embodiments 1 and 2 are directed to manufacturing methods of an organic EL display in which an ablated portion of a color filter is formed within a luminescent region. Embodiment 3 describes a manufacturing method of an organic EL display in which an ablated portion of a color filter is formed directly above a bank (non-luminescent region).

Figure 9A:
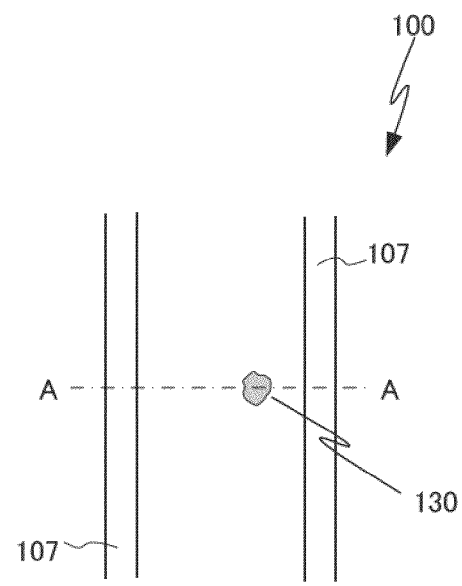
FIGS. 9A and 9B illustrate an organic EL device in a manufacturing process of an organic EL display according to Embodiment 3.
Figure 9B:
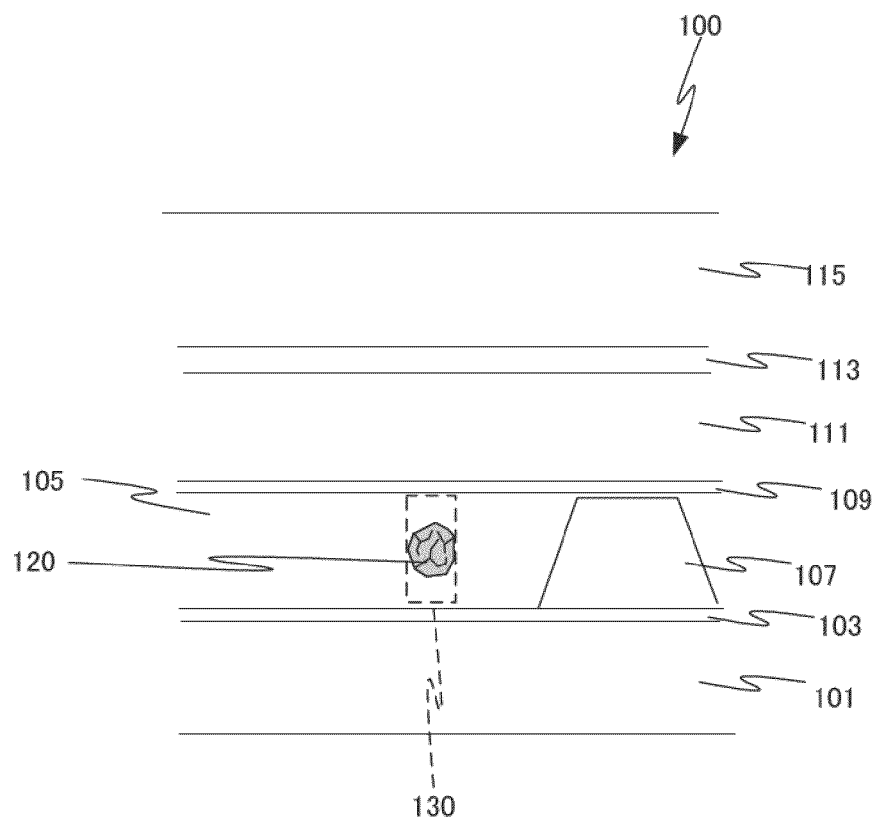

FIG. 9A is a plan view of organic EL device 100 having a defect which has been detected in the second step (a step of detecting a defect in an organic layer of an organic EL device). FIG. 9B is a sectional view of organic EL device 100 in FIG. 9A taken along dashed dotted line AA. The same components as those in Embodiment 1 are not described.

As illustrated in FIG. 9B, organic EL device 100 includes substrate 101, pixel electrode 103, organic layer 105, bank. 107, transparent counter electrode 109, sealing layer 111, and color filter 113. Organic layer 105 includes foreign material 120, and the region of organic layer 105 contaminated with foreign material 120 constitutes defect 130.

As described above, in this embodiment, an ablated portion of a color filter is formed directly above a bank (non-luminescent region). Thus, this embodiment is characterized in that a laser beam is allowed to pass through a region of a color filter directly above a bank (hereinafter simply referred to as a "color filter directly above a bank") in the third step.

In order to allow a laser beam to pass through a color filter directly above a bank, the manufacturing method of this embodiment includes a step of determining the incident position and incident angle of a laser beam (hereinafter may simply referred to as a "laser adjusting step") conducted between the second step (defect detection) and the third step (laser irradiation).

Figure 10A:
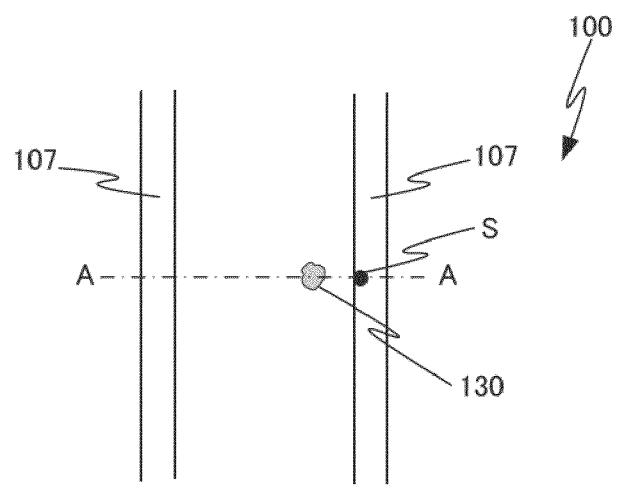
FIGS. 10A and 10B illustrate a part of the manufacturing method according to Embodiment 3.
Figure 10B:
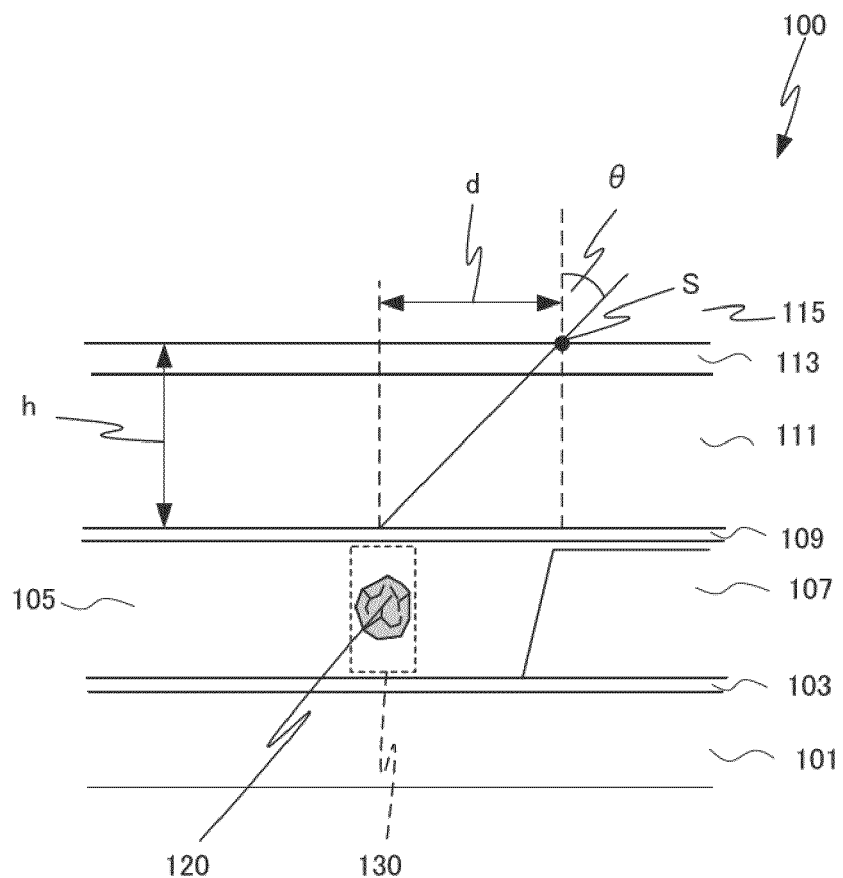

FIGS. 10A and 10B illustrate an incident position of a laser beam on an organic EL device (hereinafter may simply referred to as an "incident position") and an incident angle of a laser beam on the organic EL device (hereinafter may simply referred to as an "incident angle"). The incident position and incident angle are determined in the laser adjusting step. FIG. 10A is a plan view of organic EL device 100. FIG. 10B is an enlarged partial sectional view of organic EL device 100 in FIG. 10A taken along dashed dotted line AA.

Incident position S preferably lies on color filter 113 within a region corresponding to bank 107 of organic EL device 100 having defect 130, more preferably at the position closest to defect 130 within that region, as illustrated in FIG. 10A.

By determining incident position S, laser beam incident angle θ is determined. More specifically, when the lateral distance between defect 130 and incident position S is d and the total thickness of sealing layer 111 and color filter 113 is h as illustrated in FIG. 10B, laser beam incident angle θ is expressed by the following equation:

$$\theta = \tan^{-1}(d/h)$$

Thus, for example, when lateral distance (d) between defect 130 and incident position S is 10 μm, the thickness of sealing layer 111 is 10 μm and the thickness of color filter 113 is 1 μm, laser beam incident angle θ is about 42°.

Incident position of S and incident angle θ can be controlled by means of the incident position and incident angle of a laser beam on the surface layer (typically sealing glass 115) of the organic EL panel. Appropriate adjustment of the incident position and incident angle of a laser beam on sealing glass 115 may be accomplished by moving or tilting either the laser beam outlet or organic EL panel.

Figure 11:
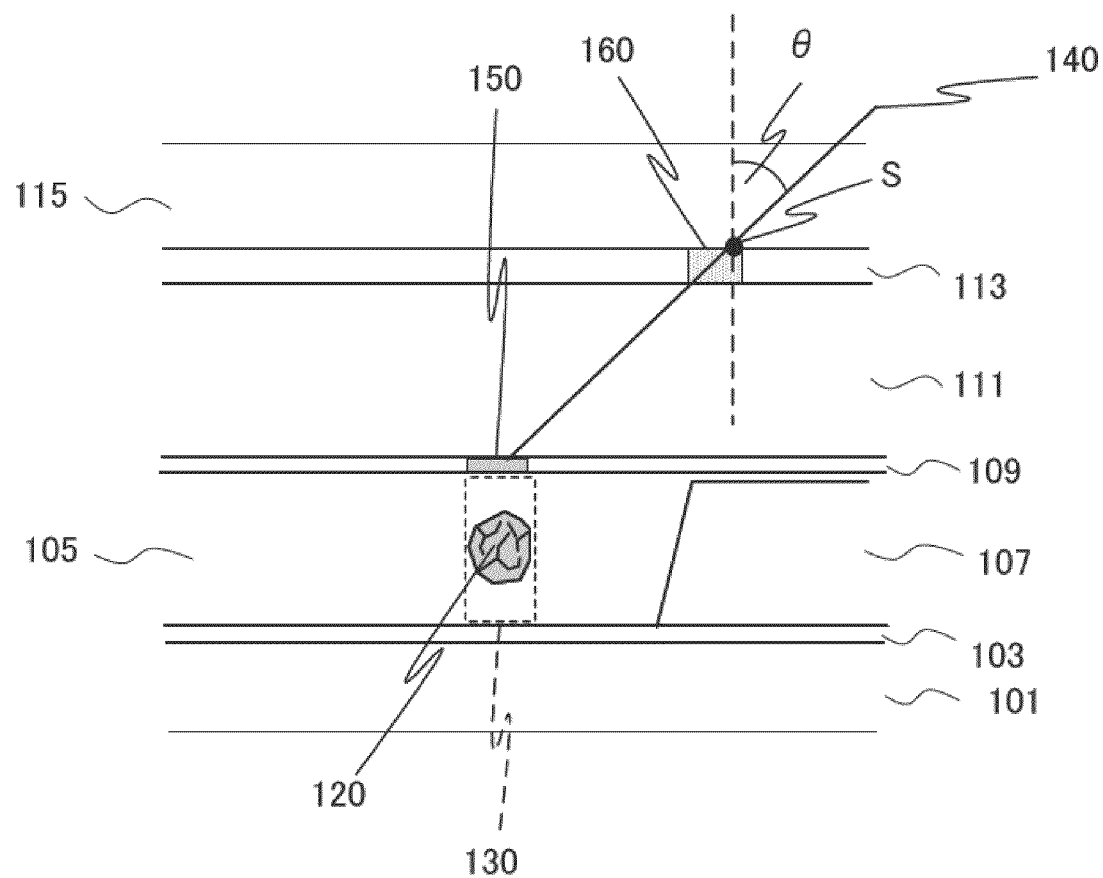
FIG. 11 illustrates a part of the manufacturing method according to Embodiment 3.

FIG. 11 illustrates the third step (a step of destroying a transparent counter electrode) in Embodiment 3. As illustrated in FIG. 11, in the third step of this embodiment, laser beam 140 is focused on a region of transparent counter electrode 109 directly above defect 130. Laser beam 140 is applied onto incident position S determined in the laser adjusting step at incident angle of θ determined in the laser adjusting step.

As illustrated in FIG. 11, laser beam 140 is applied to transparent counter electrode 109 through color filter 113 directly above bank 107. Laser beam 140 is incident on sealing glass 115, passing through color filter 113 and sealing layer 111 to reach transparent counter electrode 109.

Application of laser beam 140 destroys a portion of transparent counter electrode 109 directly above defect 130, forming destroyed portion 150 in transparent counter electrode 109. Application of laser beam 140 also results in the formation of ablated portion 160 in color filter 113.

As described above, in this embodiment, a laser beam does not pass through a color filter at positions within a luminescent region. Thus, a region of the color filter within the luminescent region is not ablated, whereby possible color reproducibility reduction caused by implementing a laser repair method can be prevented.

FIG. 12A is a plan view of organic EL device 100 repaired in the fourth step. FIG. 12B is an enlarged partial sectional view of organic EL device 100 in FIG. 12A taken along dashed dotted line AA. As illustrated in FIGS. 12A and 12B, organic EL device 100 has destroyed portion 150 of transparent counter electrode 109 directly above a defect, and ablated portion 160 of color filter 113 directly above bank 107. Thus, ablated portion 160 of color filter 113 lies in a region directly above bank 107 (non-luminescent region), not in a region within luminescent region 170.

Thus, an organic EL display manufactured in accordance with this embodiment does not show color reproducibility reduction upon light emission. According to this embodiment, it is possible to provide an organic EL display that offers higher color reproducibility.

Embodiment 4

Embodiments 1 to 3 are directed to manufacturing methods in which color reproducibility reduction is prevented by adjusting the laser beam incident angle.

However, when adjusting the laser beam incident angle as in Embodiments 1 to 3, the incident angle with respect to the surface layer (typically sealing glass) of an organic EL panel may become large. When the laser beam incident angle with respect to the surface layer of an organic EL panel is large, the surface layer shows high reflectivity to the incident laser beam; therefore, a large fraction of the laser beam is reflected at the panel surface. When a large fraction of the laser beam is reflected at the panel surface, it may result in failure to destroy a selected portion of the transparent counter electrode.

Embodiment 4 describes a manufacturing method in which possible laser beam loss caused by reflection can be reduced even when the laser beam incident angle is large.

Figure 13A:
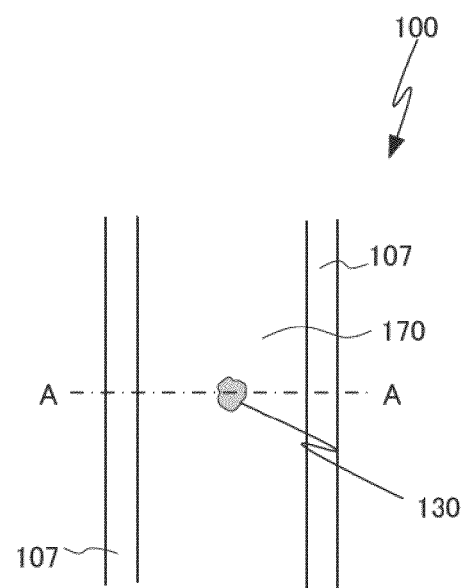
FIGS. 13A and 13B illustrate an organic EL device in a manufacturing process of an organic EL display according to Embodiment 4.
Figure 13B:
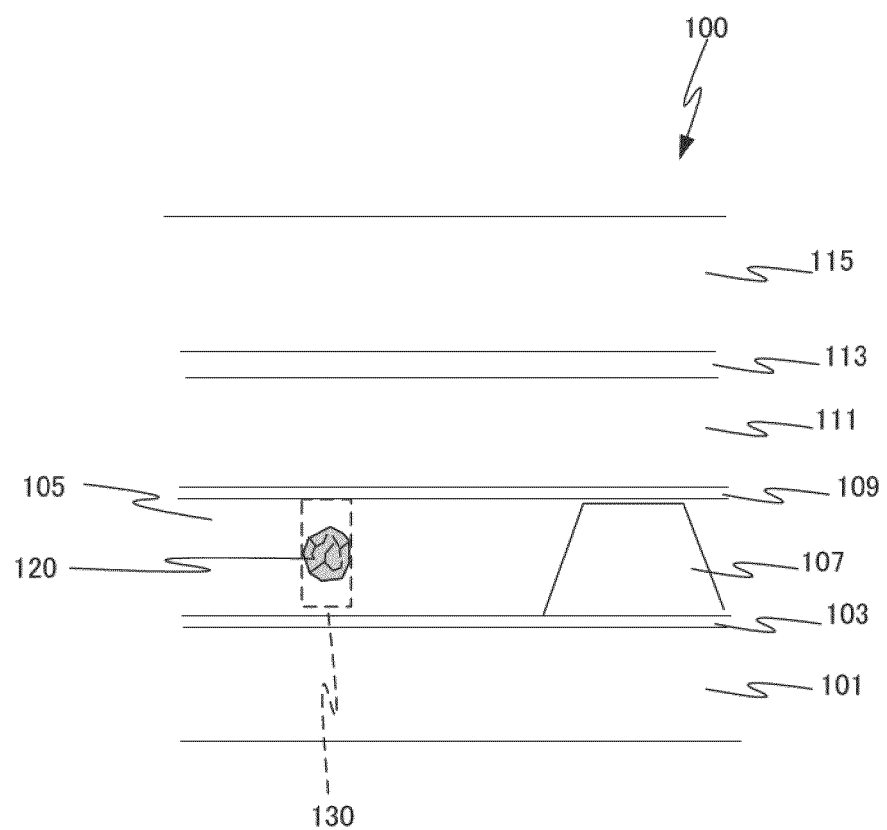

FIG. 13A is a plan view of organic EL device 100 having a defect which has been detected in the second step (a step of detecting a defect in an organic layer of an organic EL device). FIG. 13B is a partial sectional view of organic EL device 100 in FIG. 13A taken along dashed dotted line AA. Organic EL device 100 of this embodiment is identical to organic EL device 100 of Embodiment 3 except that the distance between defect 130 and the edge of bank 107 is large.

As illustrated in FIG. 13B, organic layer 105 of organic EL device 100 includes foreign material 120, and the region of organic layer 105 contaminated with foreign material 120 constitutes defect 130. The distance between defect 130 and the edge of bank 107 of this embodiment is longer than the corresponding distance d (10 µm) of Embodiment 3; for example, the distance is 30 µm in this embodiment.

Next, a third step of this embodiment will be described. As with Embodiment 3, this embodiment includes a laser adjusting step conducted between the second step (defect detection) and the third step (laser irradiation), so that a laser beam passes through a color filter at a position directly above a bank.

Figure 14A:
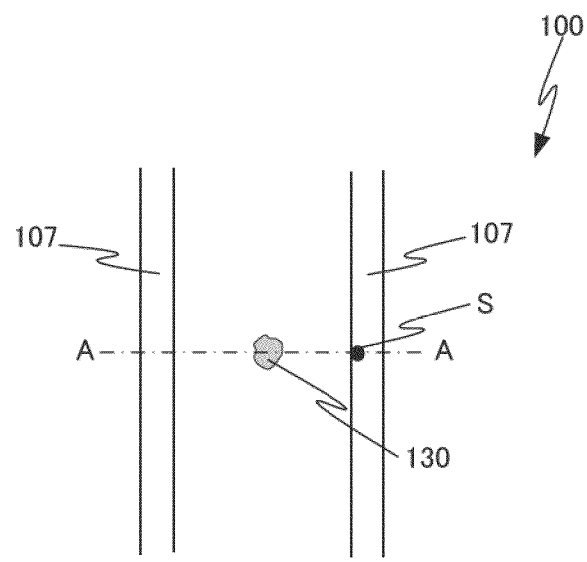
FIGS. 14A and 14B illustrate a part of the manufacturing method according to Embodiment 4.
Figure 14B:
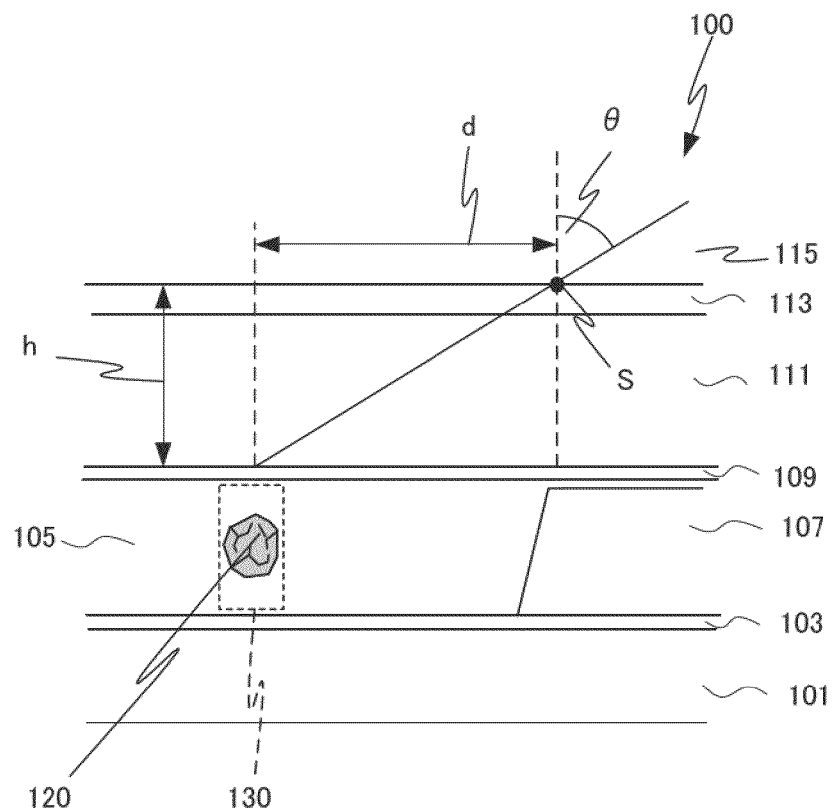

FIGS. 14A and 14B illustrate laser beam incident position S and laser beam incident angle θ, which are determined in the laser adjusting step. FIG. 14A is a plan view of organic EL device 100. FIG. 14B is an enlarged partial sectional view of organic EL device 100 in FIG. 14A taken along dashed dotted line AA. As illustrated in FIG. 14A, incident position S is positioned within a region of color filter 113 directly above bank 107, and is closest to defect 130.

As illustrated in FIG. 14B, when the lateral distance between incident position S and defect 130 is d and the total thickness of sealing layer 111 and color filter 113 is h, incident angle θ is approximately $\tan^{-1}(d/h)$.

Thus, when lateral distance (d) between defect 130 and incident position S is 30 µm, the thickness of sealing layer 111 is 10 µm and the thickness of color filter 113 is 1 µm, laser beam incident angle is about 70°.

In this embodiment, the defect-to-bank distance d is large compared to Embodiment 3. Thus, in this embodiment, incident angle θ is also large compared to Embodiment 3. Therefore, incident laser beam is tend to reflect at the organic EL panel's surface layer (sealing glass 115).

Figure 15:
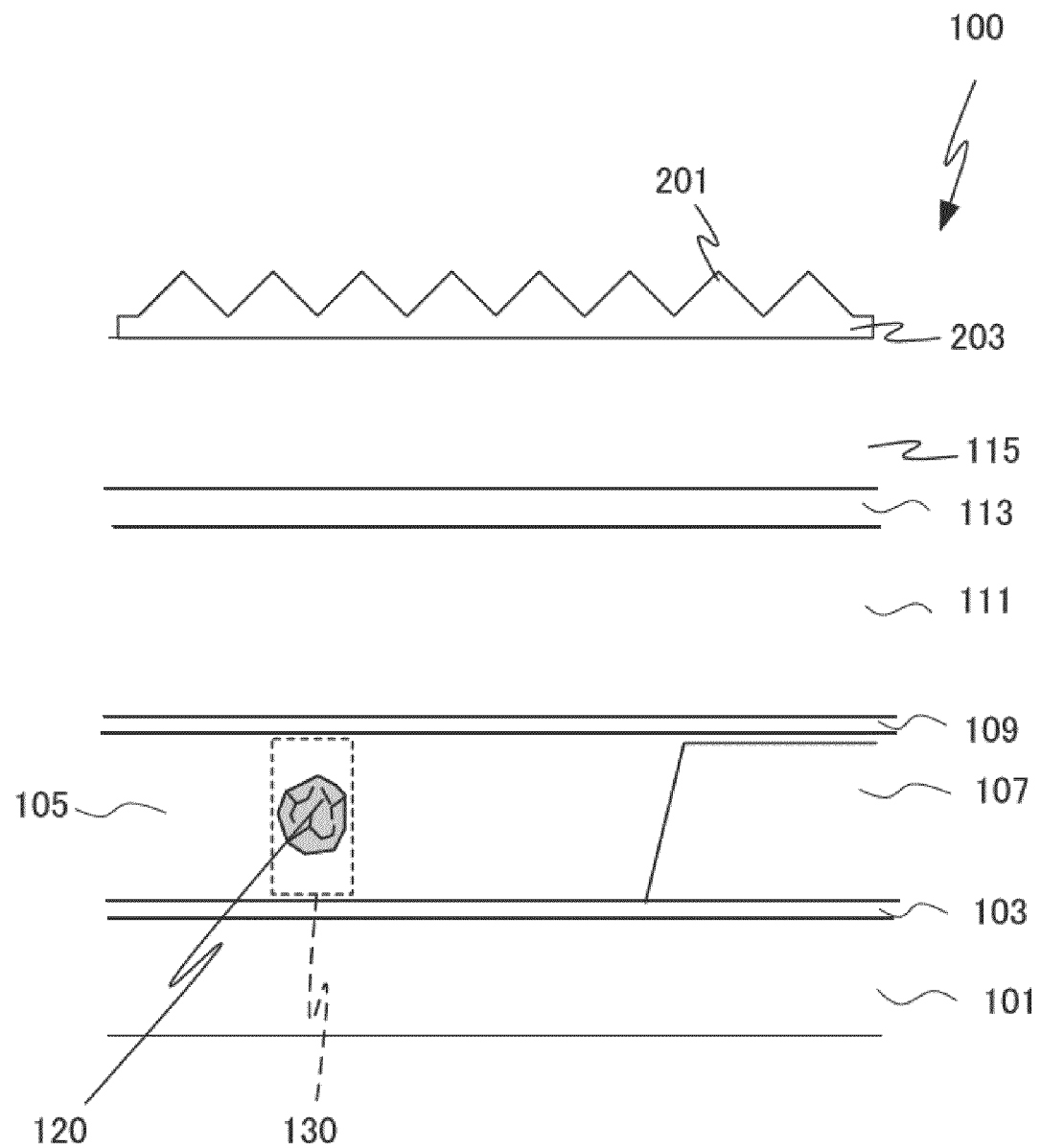
FIG. 15 illustrates a part of the manufacturing method according to Embodiment 4.

FIG. 15 illustrates a step of disposing prisms on the surface layer (sealing glass 115) of an organic EL panel. As illustrated in FIG. 15, a transparent film 203 provided with a plurality of prisms 201 is disposed on sealing glass 115. Prism 201 is an isosceles right triangle prism. Instead of film 203, liquid droplets may be disposed on sealing glass 115.

Figure 16:
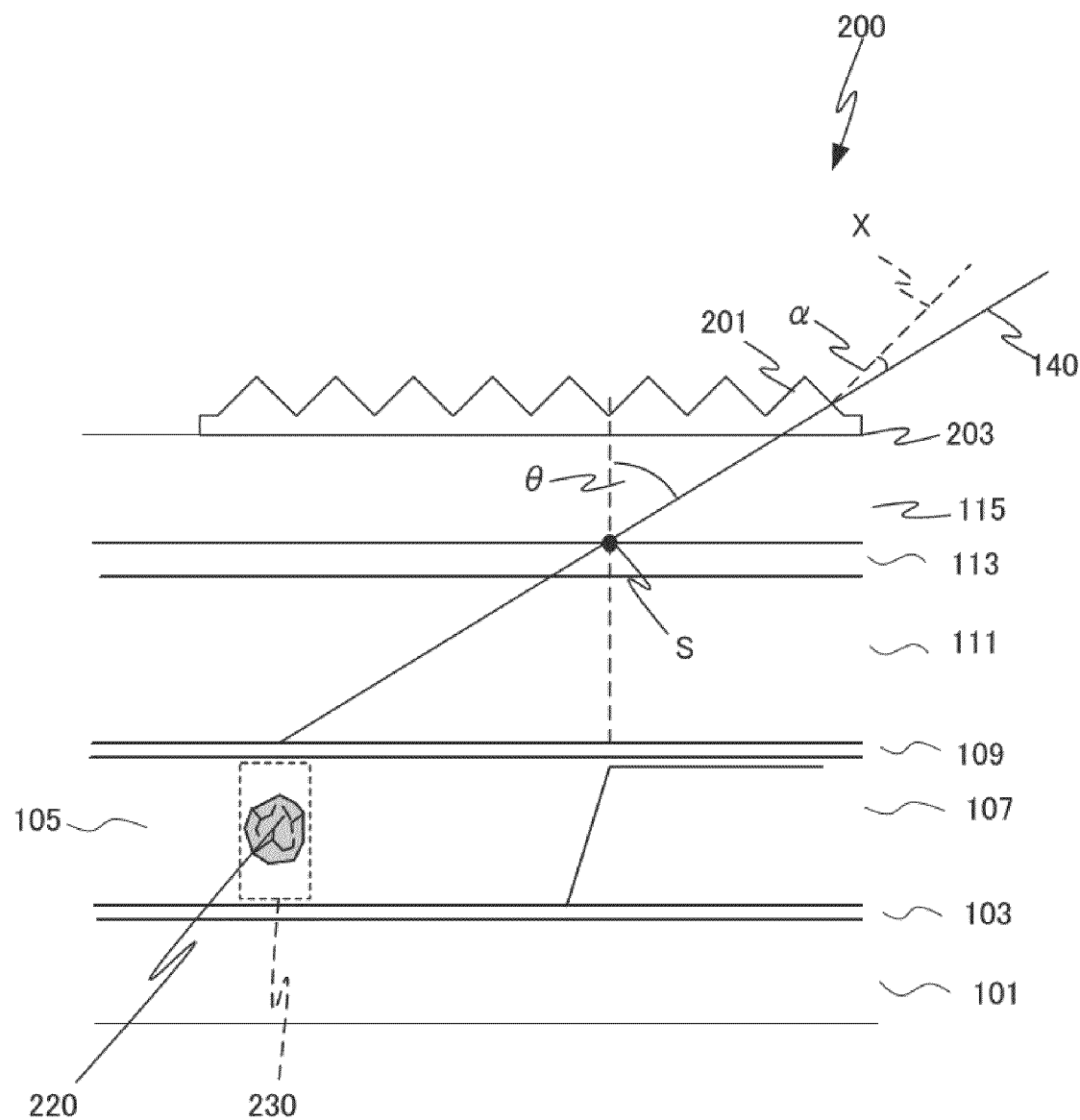
FIG. 16 illustrates a part of the manufacturing method according to Embodiment 4.

FIG. 16 illustrates a fourth step in Embodiment 4. As illustrated in FIG. 16, the third step of this embodiment is characterized in that when applying a laser beam to transparent counter electrode 109, the laser beam is allowed to pass through prism 201. Dashed line X in FIG. 16 indicates a normal to the slope of prism 201. By allowing laser beam 140 to be incident on prism 201, incident angle α of laser beam 140 on the organic EL panel can be made smaller than incident angle θ on organic EL device 100. This makes it possible to reduce laser beam loss due to reflection, which is associated with increases in the laser beam incident angle. Film 203 is peeled off after this step.

Figure 17:
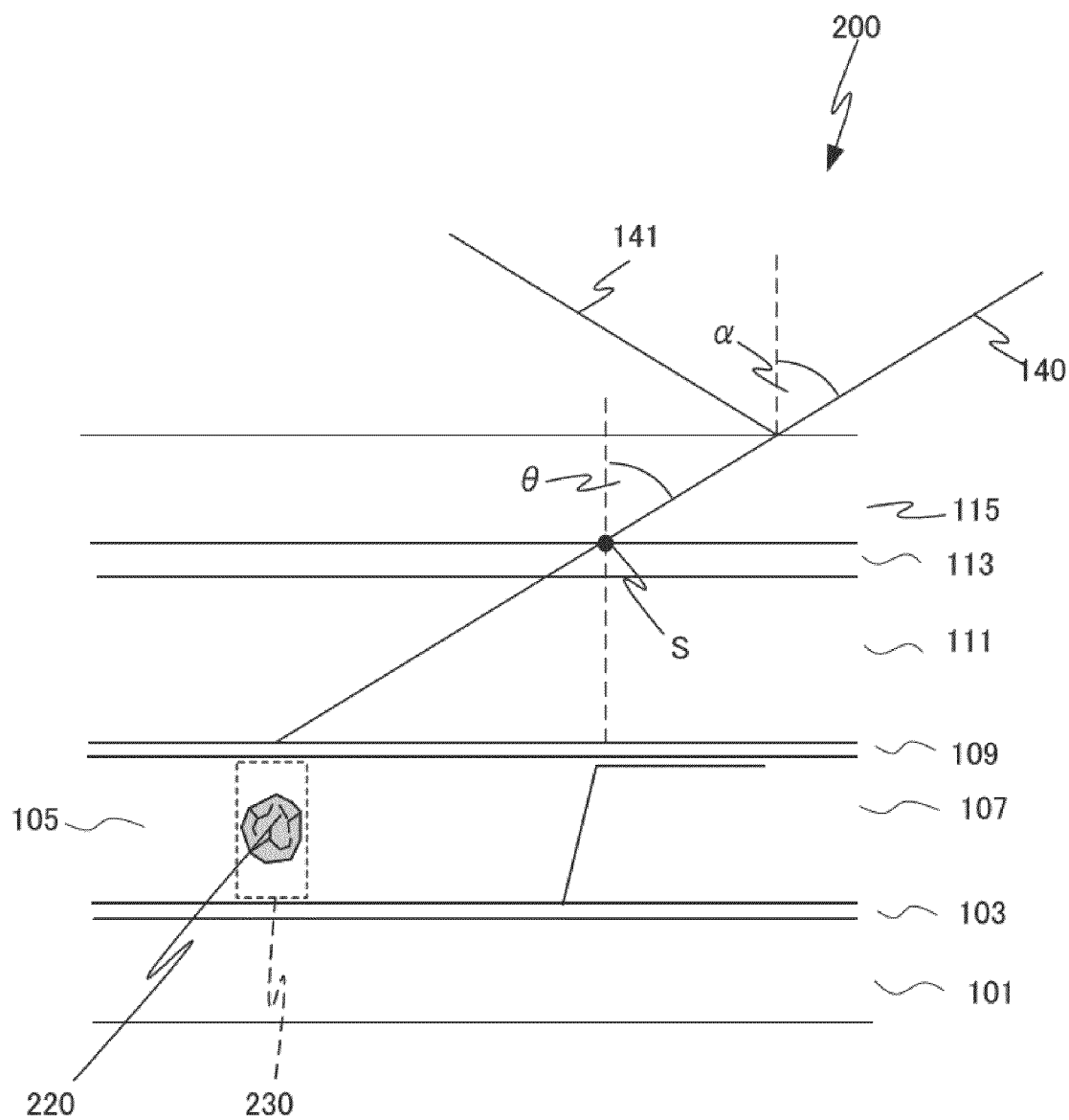
FIG. 17 illustrates a part of a manufacturing method without a prism disposing step.

On the other hand, when no prisms are disposed on sealing glass 115 as illustrated in FIG. 17, the incident angle α of laser beam 140 on sealing glass 115 becomes large, resulting a large fraction of laser beam 141 being reflected by sealing glass 115. This increases laser beam loss caused by reflection.

Thus, there is concern that more laser beam energy is needed for destroying transparent counter electrode 109 or that destruction of transparent counter electrode 109 fails.

According to this embodiment, it is possible to destroy the transparent counter electrode with a laser beam of predetermined energy even when a large laser beam incident angle is required.

This application claims the priority of Japanese Patent Application Nos. 2009-106811 and 2009-106812 both filed on Apr. 24, 2009, the content of each of which including the specification, drawings and abstract is incorporated herein by reference in its entirety.

INDUSTRIAL APPLICABILITY

The prevent invention enables defect reduction and quality improvement for organic EL displays, as well as prevention of current leakage via defects without damaging the organic layer. The present invention is also useful for the manufacture of organic EL displays that offer high color reproducibility.

In addition to organic EL displays, the present invention can also be applied to the manufacture of light-emitting devices using color filters.

REFERENCE SIGNS LIST 100, 200 Organic EL Device
101 Substrate
103 Pixel Electrode
105 Organic Layer
107 Bank
109 Transparent Counter Electrode
111 Sealing Layer
113 Color Filter
115 Sealing Glass
120 Foreign Material
130 Defect
140 Laser Beam
150 Destroyed Portion of Counter Electrode
160 Ablated Portion of Color Filter
170 Luminescent Region
201 Prism
203 Film
50 Light Emitted from Organic Layer
51 Gap between Destroyed Portion of Counter Electrode and Ablated Portion of Color Filter
60 Overlapping Region between Opening on the Top Side of Color Filter and Opening on the Bottom Side of Color Filter

The invention claimed is:
1. A method of manufacturing an active matrix organic EL display comprising:
providing an organic EL panel having a substrate and a plurality of organic EL devices disposed on the substrate in a matrix arrangement, each of the organic EL devices including a pixel electrode disposed over the substrate, an organic layer disposed over the pixel electrode, a transparent counter electrode disposed over the organic layer, a sealing layer disposed over the transparent counter electrode, and a color filter disposed over the sealing layer;
detecting a defect present in the organic layer of the organic EL device; and
destroying a portion of the transparent counter electrode directly above the defect by application of a laser beam through the color filter, wherein the laser beam is applied at an angle with respect to the normal to a display surface of the organic EL panel.

2. The method according to claim 1, wherein when the diameter of a laser irradiation region of the transparent counter electrode is "x", the thickness of the sealing layer is "y" and the incident angle of the laser beam is "θ", x, y and θ satisfy the relationship $\theta \geq \tan^{-1}(x/y)$.

3. The method according to claim 1, wherein when the thickness of the color filter is "t", the diameter of the laser beam upon passing through the color filter is not greater than 0.7 t, and the incident angle of the laser beam is equal to or larger than 45°.

4. The method according to claim 1, wherein the organic EL device further includes a bank for defining the organic layer, the color filter is disposed over the bank, and the laser beam passes through a region of the color filter directly above the bank.

5. The method according to claim 1, further comprising disposing a prism on the organic EL panel, wherein the laser beam passes through the prism.

6. The method according to claim 5, wherein the prism is an isosceles right triangle prism.

7. The method according to claim 1, further comprising disposing a liquid droplet on the organic EL panel, wherein the laser beam passes through the liquid droplet.

8. The method according to claim 1, wherein the laser beam has a wavelength of 400 nm or less.

9. The method according to claim 1, wherein a portion of the color filter through which a laser beam passed is ablated.

* * * * *